United States Patent
Zhang et al.

(10) Patent No.: US 10,129,651 B2
(45) Date of Patent: *Nov. 13, 2018

(54) CENTER-FIXED MEMS MICROPHONE MEMBRANE

(71) Applicant: Robert Bosch GmbH, Stuttgart (DE)

(72) Inventors: Yujie Zhang, Pittsburgh, PA (US); Andrew J. Doller, Sharpsburg, PA (US); Thomas Buck, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/975,097

(22) Filed: Dec. 18, 2015

(65) Prior Publication Data

US 2017/0180864 A1 Jun. 22, 2017

(51) Int. Cl.
| | |
|---|---|
| *H04R 1/08* | (2006.01) |
| *H04R 7/20* | (2006.01) |
| *H04R 19/00* | (2006.01) |
| *H04R 19/04* | (2006.01) |
| *B81B 3/00* | (2006.01) |

(Continued)

(52) U.S. Cl.
CPC .............. *H04R 7/20* (2013.01); *B81B 3/0051* (2013.01); *H04R 19/005* (2013.01); *H04R 19/04* (2013.01); *H04R 7/24* (2013.01); *H04R 31/003* (2013.01); *H04R 2231/003* (2013.01)

(58) Field of Classification Search
CPC . H04R 1/08; H04R 9/08; H04R 11/04; H04R 17/02; H04R 21/02; H04R 19/005
USPC ......................................... 381/355, 369, 175
See application file for complete search history.

(56) References Cited

U.S. PATENT DOCUMENTS

| | | | | |
|---|---|---|---|---|
| 3,594,516 A | * | 7/1971 | Storz ................... | H04R 23/006 257/416 |
| 5,870,482 A | | 2/1999 | Loeppert et al. | |

(Continued)

FOREIGN PATENT DOCUMENTS

WO    WO 2015/017979    *   2/2015  ............. H04R 17/02

OTHER PUBLICATIONS

Chrusch, D.D.; Shafai, C., "Corrugated micromachined membrane structures," Electrical and Computer Engineering, 2002. IEEE CCECE 2002. Canadian Conference on , vol. 1, No., pp. 445,449 vol. 1, 2002.

(Continued)

*Primary Examiner* — Suhan Ni
(74) *Attorney, Agent, or Firm* — Michael Best & Friedrich LLP

(57) ABSTRACT

A MEMS microphone having a backplate, a spring, and a membrane. In one embodiment, the membrane is supported in an approximate center of the membrane via a support. The support is connected to the approximate center of the membrane and an approximate center of the backplate. The membrane is connected to a spring that provides an electrical connection. The membrane may be electrically biased via the electrical connection. One or more overtravel stops are fixed to the backplate and pass through an aperture of the membrane. The overtravel stops are configured to prevent movement of the membrane in a radial direction opposite to the backplate. The membrane includes a stress gradient, a corrugation, or another structure that sets or determines a stiffness of the membrane.

19 Claims, 10 Drawing Sheets

(51) Int. Cl.
  *H04R 31/00*  (2006.01)
  *H04R 7/24*  (2006.01)

(56)  References Cited

U.S. PATENT DOCUMENTS

| | | | | |
|---|---|---|---|---|
| 7,795,695 | B2* | 9/2010 | Weigold | B81C 1/00246 |
| | | | | 181/167 |
| 8,351,625 | B2* | 1/2013 | Kasai | H04R 19/04 |
| | | | | 381/175 |
| 8,565,452 | B2 | 10/2013 | Coronato et al. | |
| 8,600,083 | B2* | 12/2013 | Chiang | H04R 19/013 |
| | | | | 381/174 |
| 8,644,528 | B2 | 2/2014 | Mehregany | |
| 8,755,541 | B2* | 6/2014 | Liu | H04R 19/005 |
| | | | | 381/174 |
| 8,861,312 | B2 | 10/2014 | Altman et al. | |
| 8,901,683 | B2* | 12/2014 | Je | B81B 7/0054 |
| | | | | 257/415 |
| 9,369,804 | B2* | 6/2016 | Buck | H04R 7/06 |
| 9,462,389 | B2* | 10/2016 | Wang | H04R 19/005 |
| 2006/0233401 | A1 | 10/2006 | Wang | |
| 2012/0033831 | A1 | 2/2012 | Leitner | |
| 2012/0091546 | A1 | 4/2012 | Langereis et al. | |
| 2013/0016859 | A1 | 1/2013 | Buck | |
| 2013/0264663 | A1 | 10/2013 | Dehe et al. | |
| 2015/0110302 | A1 | 4/2015 | Chen et al. | |

OTHER PUBLICATIONS

International Preliminary Search Report for Application No. PCT/EP2016/079941 dated Feb. 14, 2017 (7 pages).

* cited by examiner

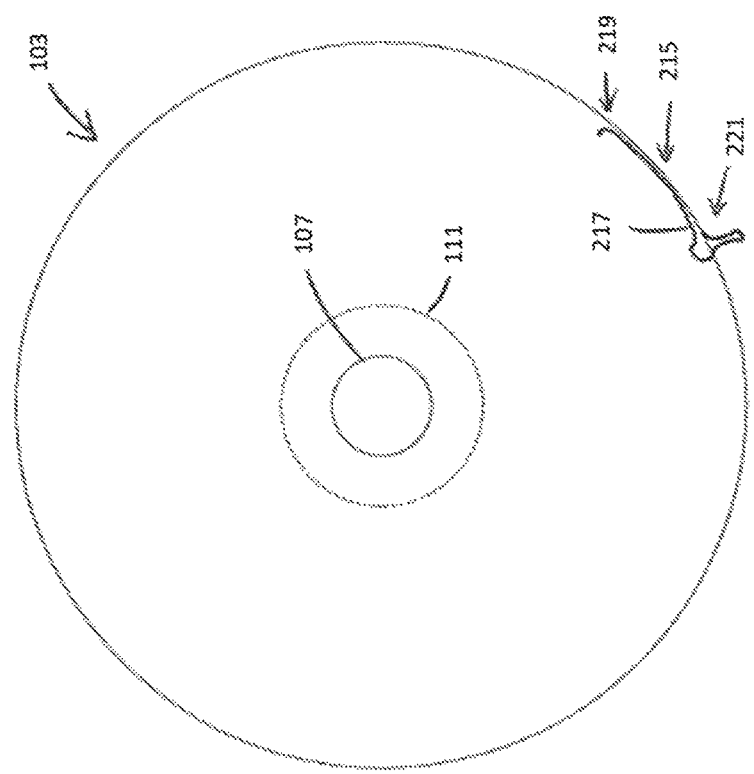
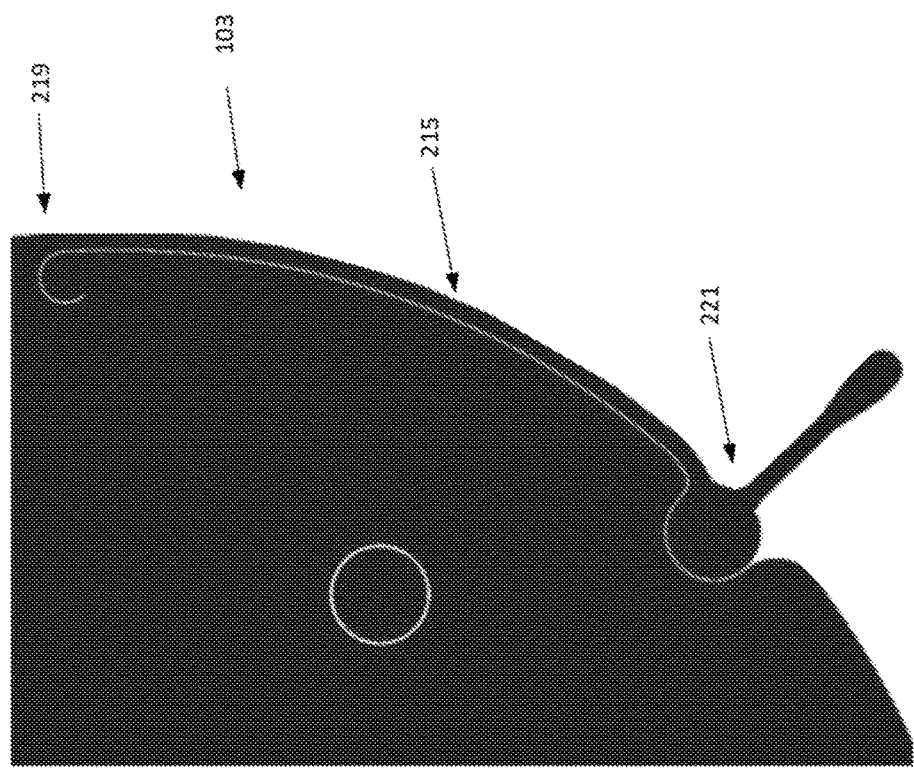

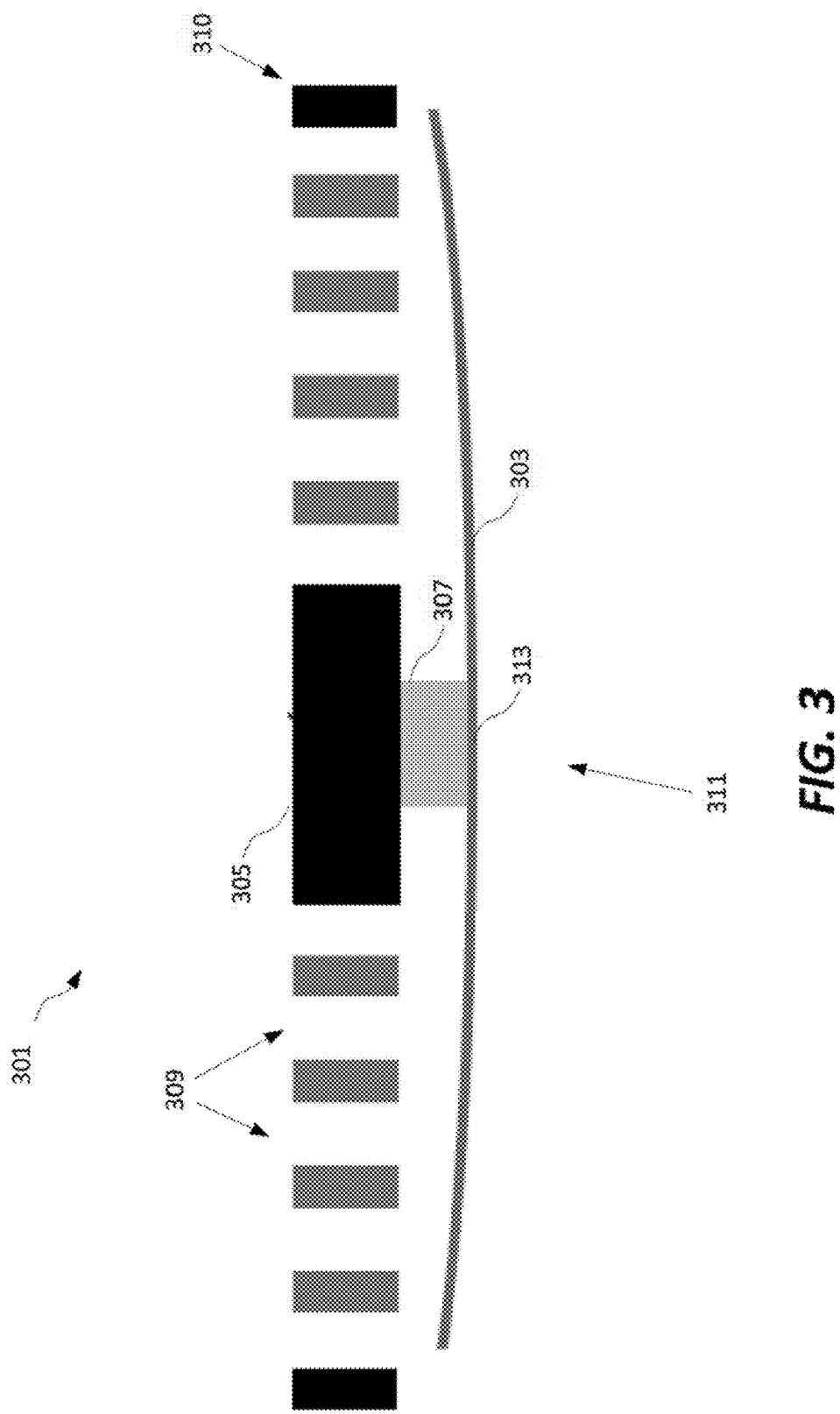

CENTER-FIXED MEMS MICROPHONE MEMBRANE

BACKGROUND

Embodiments of the disclosure relate to micro-electromechanical system (MEMS) microphones and methods of their construction. In particular, embodiments of the disclosure relate to constructions of a membrane of the MEMS microphone and overtravel stops that support said membrane.

Capacitive MEMS microphones measure sound pressure levels with a pressure-sensitive membrane. The membrane must be of sufficient mechanical strength to withstand various acoustic pressures without being destroyed. In addition to mechanical strength, the membrane must be sensitive to sensing small acoustic pressures. Sensitivity, natural frequency, and response characteristics are affected by the construction and shape of the membrane and the mounting of the membrane to the MEMS microphone die. Therefore, performance of the MEMS microphone is due, at least in part, to the membrane structure and mounting configurations of the membrane.

SUMMARY

Certain embodiments provide a MEMS microphone including a membrane with features that determine a stiffness of the membrane. One particular embodiment provides a MEMS microphone that includes at least one spring having a first end and a second end. The first end of the spring is connected to the membrane. The MEMS microphone also includes a backplate and a support connected to a central region of the membrane. The support is also connected to the backplate. The support is positioned between the membrane and the backplate.

Another embodiment provides a method of limiting the movement of a membrane of a MEMS microphone. The MEMS microphone includes a backplate, an overtravel stop, and a spring. The method includes coupling a first end of the spring to the membrane and coupling a central region of the membrane via a support to a central region of the backplate. An overtravel stop is positioned through an aperture in the membrane.

Other aspects of embodiments of the disclosure will become apparent by consideration of the detailed description and accompanying drawings.

BRIEF DESCRIPTION OF THE DRAWINGS

FIGS. 2A and 2B are partial top views of the MEMS microphone of FIG. 1A.

FIG. 3 is a cross-sectional view of a MEMS microphone according to another embodiment.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

A typical MEMS microphone senses acoustic pressure with a flexible member connected with one or more springs to a housing or a rigid member of the MEMS microphone. In one example, the flexible member may be a membrane such as a diaphragm and the rigid member may be a backplate. In another example, the flexible member may be a backplate while the rigid member may be a membrane. In the examples illustrated, the flexible member is the membrane and the rigid member is the backplate. The membrane is biased with a voltage differential relative to the backplate. When the membrane deflects due to acoustic pressure, a distance between the membrane and the backplate varies in proportion to the magnitude of the acoustic pressure. As the distance fluctuates, an amount of capacitance between the membrane and the backplate varies in proportion to the change in distance. The amount of capacitance on across the membrane and the backplate sets a potential that varies proportionally to the change in capacitance. A preamplifier generates an electrical signal indicative of the amount and change of potential and acoustic pressure incident on the membrane.

Figure 1A:
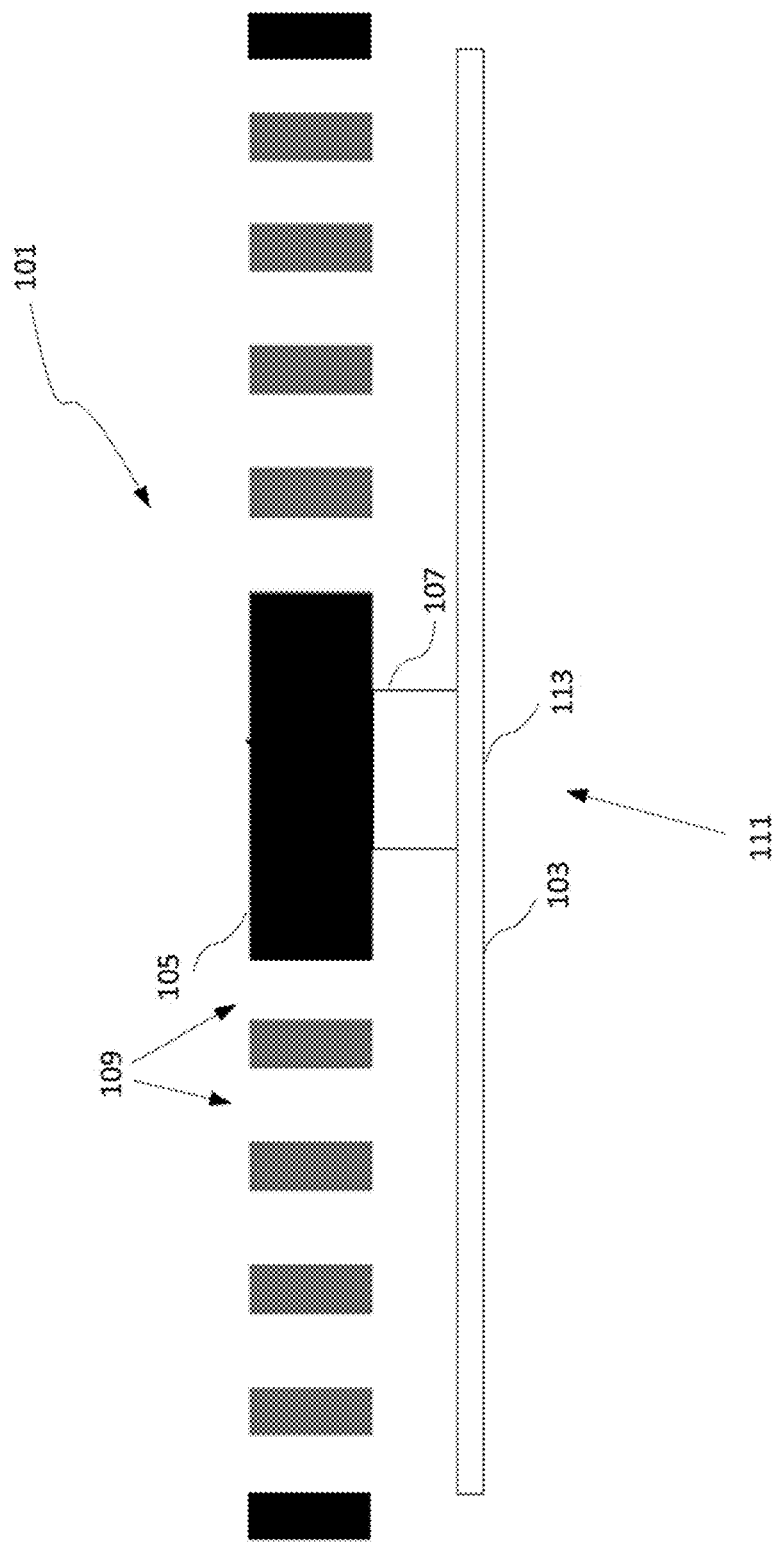
FIGS. 1A through 1C are cross-sectional views of a MEMS microphone with a center-supported membrane according to various embodiments of the disclosure.

FIG. 1A illustrates a cross-sectional view of a MEMS microphone 101 in accordance with one embodiment. The MEMS microphone 101 includes a membrane 103, a backplate 105, and a support member 107. The backplate 105 includes perforations 109 (e.g., acoustic holes/vents) that allow sound waves to pass through the backplate 105. The sound waves impinge on the membrane 103 and cause deflection of the membrane 103 with respect to the backplate 105. The backplate 105 and the membrane 103 may be flat, circular, and/or positioned in parallel layers. The backplate 105 and the membrane 103 are spaced a predetermined distance apart in a radial direction of the membrane 103 and the backplate 105. The support member 107 sets the predetermined distance of spacing between the backplate 105 and the membrane 103. The backplate 105 may be fabricated as a single layer formed from polysilicon. In some embodiments, the backplate 105 may be fabricated as a plurality of layers. The materials, in one embodiment, may be gold material deposited on silicon nitride or polysilicon by various types of deposition. Other types of material for forming single or multiple layered backplate are possible, depending on applications. The membrane 103 may be fabricated from materials such as polysilicon, silicon, or the like. Other types of materials for forming the membrane 103 are possible, depending on the application.

In some embodiments, the support member 107 is formed in a substrate and couples an inner region 111 of the membrane 103 to the backplate 105 either directly or indirectly. As a consequence, the membrane 103 is mechanically connected to the support member 107, and the support member 107 is mechanically connected to the backplate 105. As shown, the membrane 103 coupled to the backplate 105 via the support member 107 is suspended freely below the backplate 105. The support member 107 may be non-conductive and/or formed of a metal oxide and may provide electrical isolation between the backplate 105 and the membrane 103. The support member 107 may be positioned near an approximate center 113 of the membrane 103 and/or the backplate 105. For example, the support member 107 may be located at an approximate geographical center located at the inner region 111 of the membrane 103. The approximate center 113 of the membrane 103 is positionally fixed relative to the backplate 105 by the support member 107. Although one support member 107 is illustrated herein, more than one support member may be incorporated into the MEMS microphone 101 to space the backplate and the membrane apart.

Figure 1B:
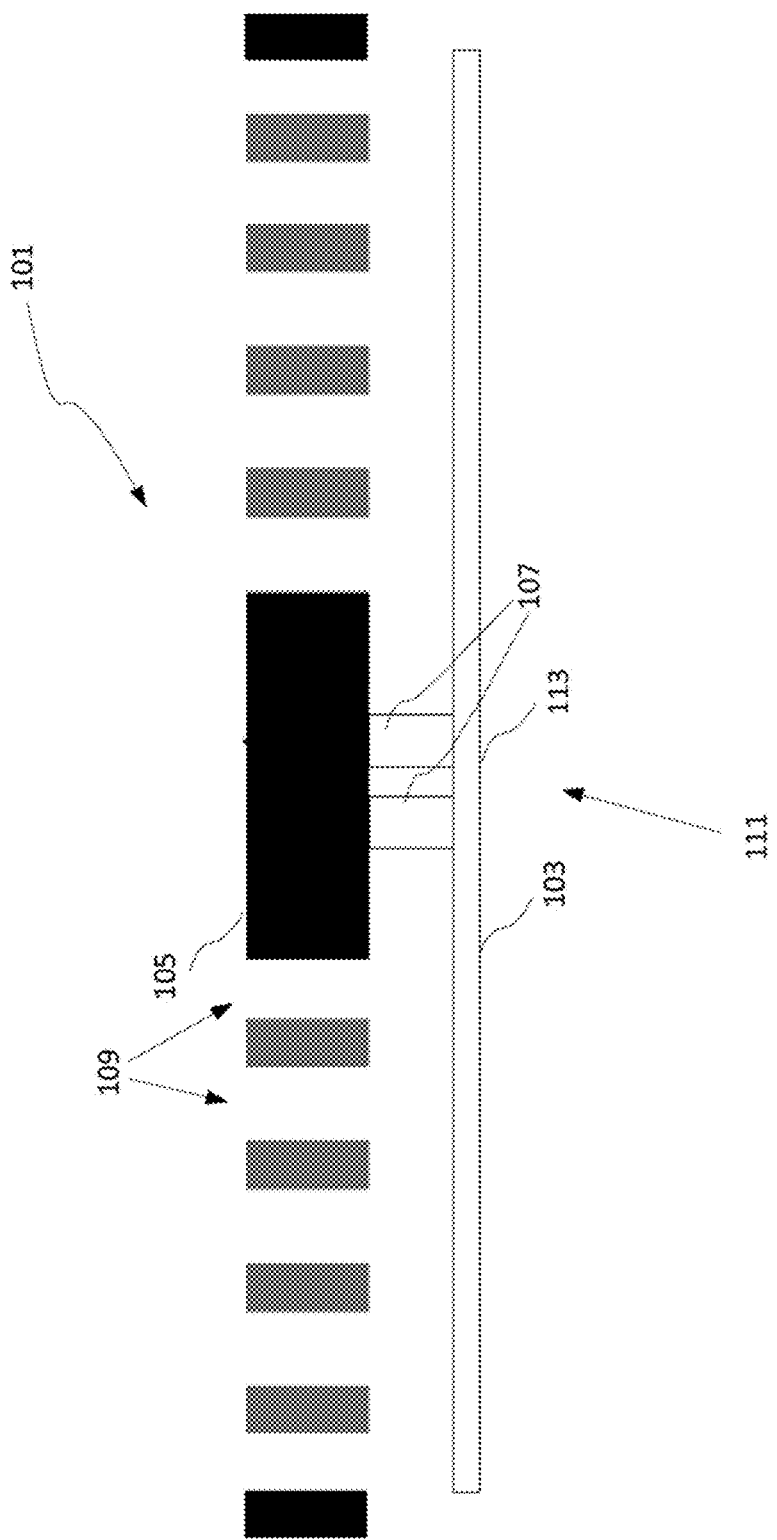
Figure 1C:
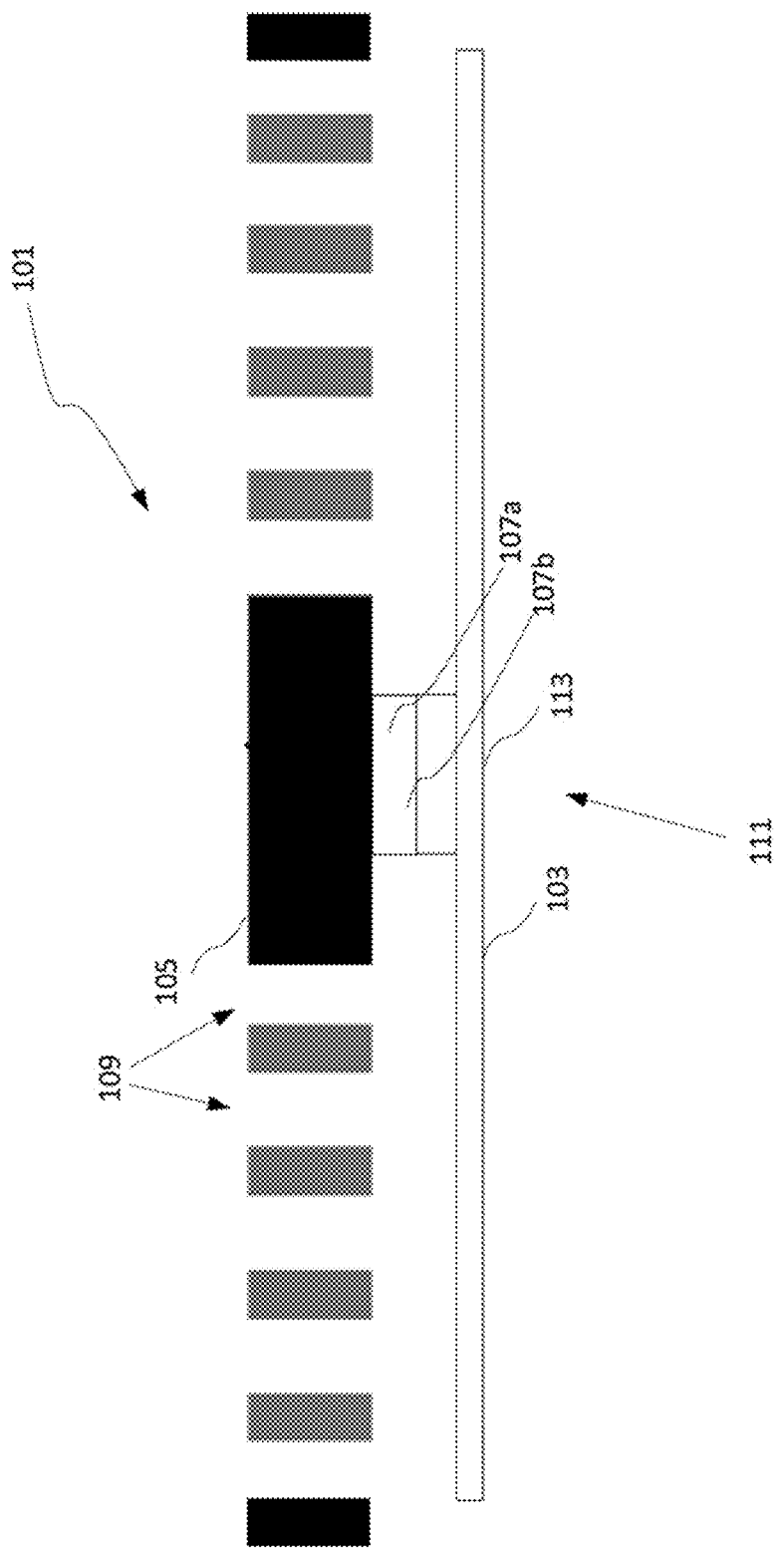

As illustrated in FIG. 1B, a plurality of support members 107 positioned side by side couple the inner region 111 of the membrane 103 to the backplate 105 either directly or indirectly. The support members 107, in some embodiments, have equal height and width. In other embodiments, one of the support members 107 may have a width greater or lesser than the width of another one of the other support members 107 without sacrificing the performance of the MEMS microphone 101. More than two support members 107 may be provided between the membrane 103 and the backplate 105, depending on the applications. As illustrated in FIG. 1C, the MEMS microphone 101 also include a plurality of support members 107 for coupling the membrane 103 to the backplate 105. As depicted, the support members 107 are in a stacked configuration which is different from the support members in side-by-side configuration as illustrated in FIG. 1B. Unlike the previous figures, whether a single support member 107 as illustrated in FIG. 1A or side-by-side support members 107 as illustrated in FIG. 1B, the support members 107 coupled to both the backplate 105 and the membrane 103. As illustrated in FIG. 1C, a top support member 107a is coupled to the backplate 105 whereas a bottom support member 107b is coupled to the membrane 103. The top support member 107a and the bottom support member 107b are attached to each other by various fastening techniques. In one example, the support members 107a, 107b may be formed of same material. In another example, the support members 107a, 107b may be formed of different material. In yet another example, the support members 107a, 107b and the backplate 105 may be formed from the same material. An optional insulating layer member may be formed between the support members 107a, 107b to isolate the membrane 103 and the backplate 105. The support members 107 in FIGS. 1A-1C may be in various forms of geometry, size, and shape, depending on the particular application.

FIGS. 2A and 2B are top views of the membrane 103 of FIG. 1A. In these figures, the backplate 105 has been removed for purposes of illustration. FIG. 2A is a full top view of the membrane 103. FIG. 2B is a close-up view of a portion of the membrane 103. The membrane 103 includes a spring 215. The spring 215 is formed from a portion of the same structure as the membrane 103. A separation 217 (e.g., a slit) is made between the membrane 103 and the spring 215. The separation 217 may be formed by slicing along a perimeter of the portion of the membrane 103 thus decoupling at least part of the spring 215 from the membrane 103. The spring 215 remains connected to the membrane at a first end 219. At a second end 221, the spring 215 is connected to either the backplate 105 or a part of the housing of the MEMS microphone 101. The spring 215 provides an electrical pathway to generate a bias voltage on the membrane 103. In some embodiments, the MEMS microphone 101 contains only a single spring 215. In such embodiments, the spring 215 provides a single electrical connection point to the membrane 103. In some embodiments, as in the illustrated embodiment, the spring 215 is long and narrow. In other examples, the spring 215 may be short and wide, depending on the particular application. A spring 215 that is long and narrow has a low stiffness factor that has reduced or little effect on the overall stiffness of the membrane 103. Therefore, in such embodiments, the spring 215 has little impact on mechanical performance and characteristics of the membrane 103. In addition, the spring 215 has little impact on the responsiveness of the MEMS microphone 101 to acoustic pressure.

The characteristics of the membrane 103, such as shape, size, and material may alter the response of the membrane 103 to incident sound waves. As such, these characteristics also determine stiffness, natural frequency, and mode shapes of the MEMS microphone 101. When the membrane 103 receives incident acoustic pressure, the membrane flexes around the support member 107 based on the stiffness of the membrane 103. Since the membrane 103 is not supported from its perimeter, mechanical connections at the perimeter (e.g., springs) do not have an appreciable effect on the performance of the MEMS microphone 101. Rather, when the membrane 103 is fixed at the center, the characteristics of the membrane 103 may be adjusted by introducing variations into the design and structure of the membrane 103. Variants produced by these variations are illustrated by the embodiments shown in FIGS. 3-5.

FIG. 3 is a cross-sectional view of a MEMS microphone 301 according to another embodiment. The MEMS microphone 301 includes a membrane 303, a backplate 305, and a support member 307. The support member 307 is formed in a substrate and couples an inner region 311 of the membrane 303 to the backplate 305 either directly or indirectly. The support member 307 may be fixed to the membrane 303 at an approximate center 313 of the membrane 303. The MEMS microphone 301 also includes perforations 309 in the backplate 305 that allow sound waves to pass through the backplate 305. In this embodiment, the membrane 303 has a predetermined stress gradient and a curvature of the membrane 303. In other respects the MEMS microphone 301 is the same as the MEMS microphone 101. The membrane 303 coupled to the backplate 305 via the support member 307 is suspended freely below the backplate 305. The predetermined stress gradient is set at the time of manufacture to achieve a desired curvature of the membrane 303. Based on the stress gradient and the curvature, the stiffness of the membrane 303 is increased by a certain factor as the stress gradient is increased. The membrane 303 is manufactured to exhibit and maintain the predetermined stress gradient according to design specifications. In one embodiment, the curvature caused from the stress gradient may be induced toward a perimeter 310 of the backplate 305, as depicted in FIG. 3. Alternatively, the curvature may be induced away from the perimeter 310 of the backplate 305. The stress gradient is predetermined such that a desired stiffness, natural frequency, and mode shapes are also predetermined for the MEMS microphone 301. Although only one support member 307 is illustrated, it is understood that a plurality of support members in a stacked configuration, side-by-side configuration, or the like, as illustrated in previous figures, may be used.

Figure 4A:
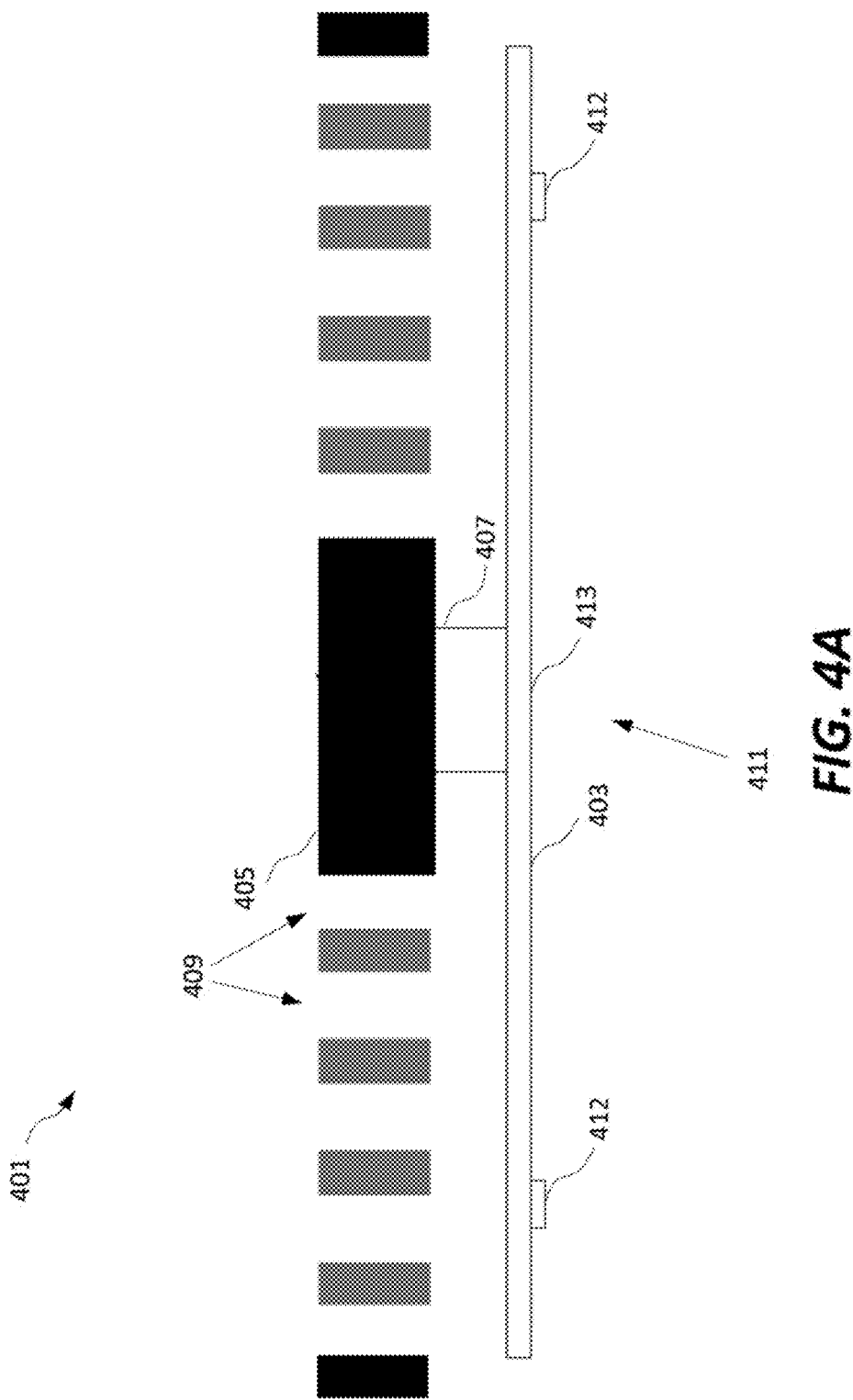
FIG. 4A is a cross-sectional view of a MEMS microphone according to yet another embodiment.
Figure 4C:
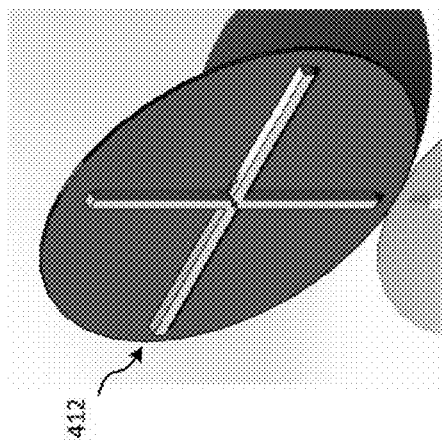
FIGS. 4B through 4D are perspective views of the MEMS microphone of FIG. 4A with various types of structure.
Figure 4D:
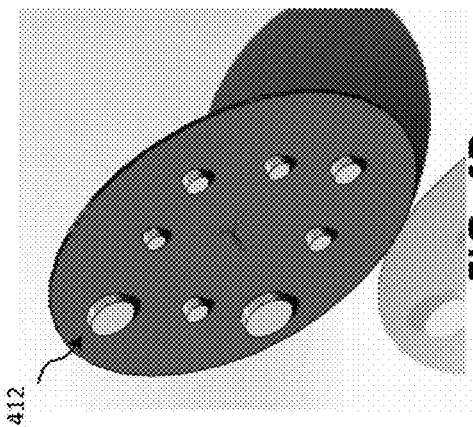
Figure 4B:
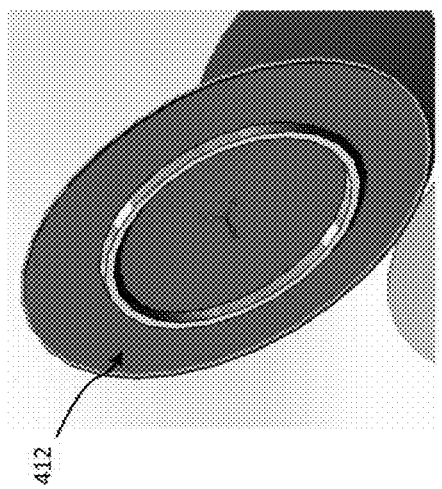

FIG. 4A is a cross-sectional view of a MEMS microphone 401 according to yet another embodiment. The MEMS microphone 401 includes a membrane 403, a backplate 405, and a support member 407. The support member 407 is formed in a substrate and couples an inner region 411 of the membrane 403 to the backplate 405 either directly or indirectly. The support member 407 may be fixed to the membrane 403 at an approximate center 413 of the membrane 403. The MEMS microphone 401 also includes perforations 409 in the backplate 405 as in the previously described embodiments. In this embodiment, the membrane 403 includes a structure 412 affixed to the membrane 403. In other respects, the MEMS microphone 401 is the same as the MEMS microphones 101 and 301. The membrane 403 is manufactured such that the structure 412 is incorporated in the membrane 403 itself, on a top of the membrane 403, or on a bottom of the membrane 403. The structure 412 may take a variety of forms. As illustrated in FIG. 4B, the structure 412 may be in the form of circle beam. Although only one circle beam is illustrated, more than one circle beam may be incorporated into the MEMS microphone 401. For example, an optional inner circle beam may be provided within the structure 412. In another example, an optional outer circle beam may surround the structure 412. In yet another embodiment, a plurality of circle beams may be formed either within the structure 412 or surround the outer region of the structure 412, or combination thereof. The structure 412 as illustrated in FIG. 4C, is different from the previous embodiment. In FIG. 4C, the structure is in the form of a radial beam or spokes. The structure 412, in the embodiment illustrated in FIG. 4D, may include a plurality of spots affixed to the membrane 403. The spots can come in various sizes, shapes, and geometries. For example, the structure 412 may be a rib, a circle beam, a spot, a spoke or some combination of these forms. The structure 412 may be formed at the same time as the membrane 403 such that the structure 412 forms a single contiguous surface with the membrane 403. The membrane 403 has predetermined response characteristics based on the type and form of the structure 412. For example, the MEMS microphone 401 has its stiffness, natural frequency, and mode shapes determined, at least in part, on the structure 412. The size and shape of the structure 412 is determined such that the desired response characteristics of the MEMS microphone 401 are achieved. Although only one support member 407 is illustrated in FIG. 4A, it is understood that a plurality of support members in a stacked configuration, side-by-side configuration, or the like, as illustrated in previous figures may be incorporated into the MEMS microphone 401.

Figure 5:
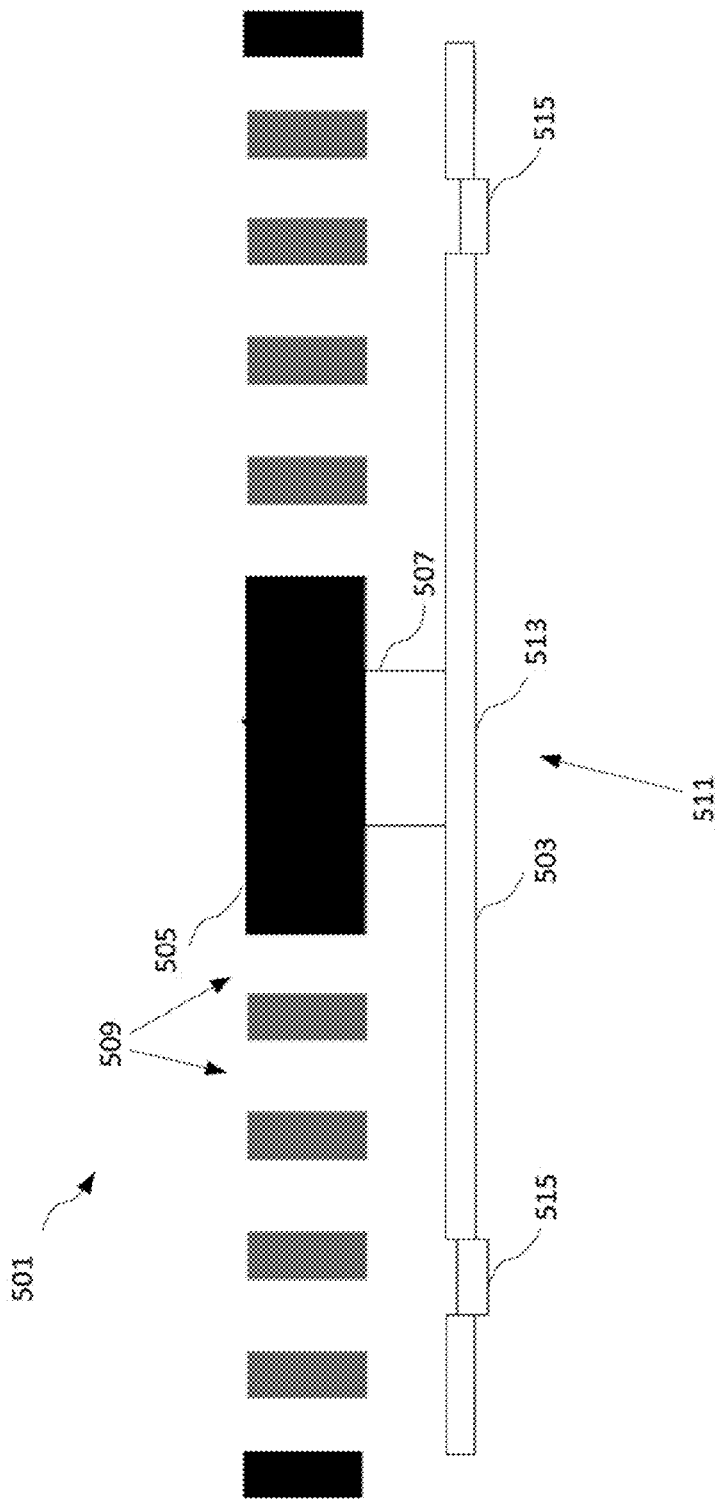
FIG. 5 is a cross-sectional view of a MEMS microphone according to yet another embodiment.

FIG. 5 is a cross-sectional view of a MEMS microphone 501 according to yet another embodiment. The MEMS microphone 501 includes a membrane 503, a backplate 505, and a support member 507. The support member 507 is formed in a substrate and couples a center region 511 of the membrane 503 to the backplate 505 either directly or indirectly. The support member 507 may be fixed to the membrane 503 at an approximate center 513 of the membrane 503. The MEMS microphone 501 also includes perforations 509 in the backplate 505 as in the previously described embodiments. In this embodiment, the membrane 503 includes a corrugation 515 on the membrane 503. The corrugation 515 includes one or more grooves or ridges positioned within, on a top, or on a bottom of the membrane 503. The corrugation 515 may include a single groove or ridge or may include multiple grooves or ridges extending radially along the membrane 503. The corrugation 515 may take different forms of size and geometry. The response characteristics of the MEMS microphone 501 may be tuned, in part, based on the types and sizes of the corrugation 515. The membrane 503 has its stiffness, natural frequency, and mode shapes determined, at least in part, by the type and size of the corrugation 515. Although only one support member 507 is illustrated, it is understood that a plurality of support members 107 in a stacked configuration, side-by-side configuration, or the like, as illustrated in previous figures may be incorporated into the MEMS microphone 501.

Figure 6:
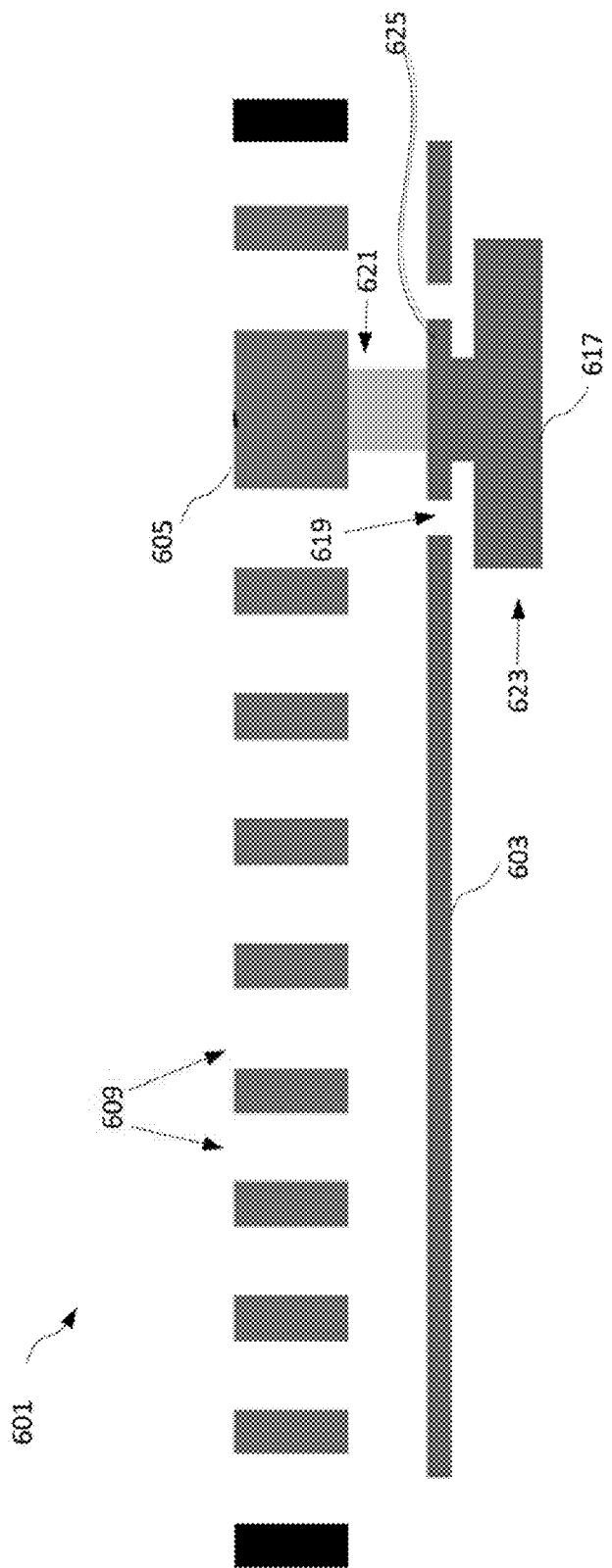
FIG. 6 is a cross-sectional view of a MEMS microphone with an overtravel stop according to one embodiment of the disclosure

FIG. 6 is a cross-sectional view of a MEMS microphone 601 according to yet another embodiment. The MEMS microphone 601 includes a membrane 603 (support for the membrane not shown) and a backplate 605. As in the previous embodiments, the MEMS microphone 601 includes perforations 609 in the backplate 605. In this embodiment, the MEMS microphone 601 includes an overtravel stop 617. The overtravel stop 617 may be used in combination with any or all of the other embodiments. As such, this embodiment provides configurations for bracing the membranes 103, 303, 403, 503, as described in other embodiments, against excessive travel in at least an axial direction opposite the backplate 605. In some embodiments, the backplate 605 itself provides an overtravel stop toward the backplate 605.

The overtravel stop 617 passes through an aperture 619 of the membrane 603. The overtravel stop 617 is positionally fixed relative to the MEMS microphone 601. In some embodiments, the overtravel stop 617 and the backplate 605 are formed of a single structure (e.g., a substrate). The overtravel stop 617 includes a first end 621 affixed to the backplate 605 and a second end 623 positioned on an opposite side of the membrane 603 as the backplate 605. Although not illustrated, in some embodiments, the second end 623 is fixed to a portion of the MEMS microphone 601 other than the membrane 603. In another embodiment, the first end 621 is a support member similar to the support members 107, 307, 407, 507 illustrated in other embodiments. In another embodiment, the overtravel stop 617 includes only the second end 623 extended at a distance from the membrane 603 via an optional connecting member 625. In yet another embodiment, the overtravel stop 617 includes only the second end 623 directly suspended below the membrane 603 without the connecting member 625. At least a portion of the second end 623 is larger than the aperture 619. The second end 623 prevents the membrane 603 from moving beyond the position of the overtravel stop 617 in a direction opposite of the backplate 605. The membrane 603 is free to move with respect to the overtravel stop 617 until the membrane 603 reaches a maximum deflection (i.e., a furthest point of travel). At the maximum deflection, the second end 623 of the overtravel stop 617 contacts the membrane 603 and prevents further movement.

The overtravel stop 617 may be non-conductive and/or formed of a metal oxide and may provide electrical isolation between the backplate 605 and the membrane 603. Other types of material may be used to form the overtravel stop 617, depending on the particular application. The overtravel stop 617 may be positioned in various discrete locations along the membrane 603. For example, the overtravel stop 617 may be positioned proximal to a support member of the membrane 603. In some embodiments, a plurality of overtravel stops 617 may be used. The overtravel stops 617 may be positioned around the support members 107, 307, 407, and 507 in various configurations, such as, having multiple overtravel stops 617 positioned approximately equal radial distances from the support members 107, 307, 407, and 507. In this case, the overtravel stops 617 may also be positioned equal distances from each other, such as, on opposite sides of the support members 107, 307, 407, and 507. The overtravel stops 617 may also be positioned with approximately equal spacing around the perimeter of the membranes 103, 303, 403, 503, and 603 and with approximately equal distances between each of the overtravel stops 617.

Based on the acoustic pressure, the membranes 103, 303, 403, 503, and 603 experience differing magnitudes of acceleration in an axial direction (e.g., a direction of applied acoustic pressure). If the acoustic pressure is large enough, the acceleration may exceed the restorative force of the one or more springs 215 and the resisting force provided by the stiffness of the membranes 103, 303, 403, 503, and 603. Since the restorative force of the springs 215 may be minimal, the overtravel stop 617 provides additional support for the membrane 103. In such cases, the overtravel stop 617 prevents overtravel and, as a consequence, potential damage to the membranes 103, 303, 403, 503, and 603. Therefore, the overtravel stop 617 helps protect the membrane 103, 303, 403, 503, and 603 from large changes in acceleration of the MEMS microphone 101, as may occur, for example, as a result of impacts, heavy vibrations, and large pressure waves.

Figure 7:
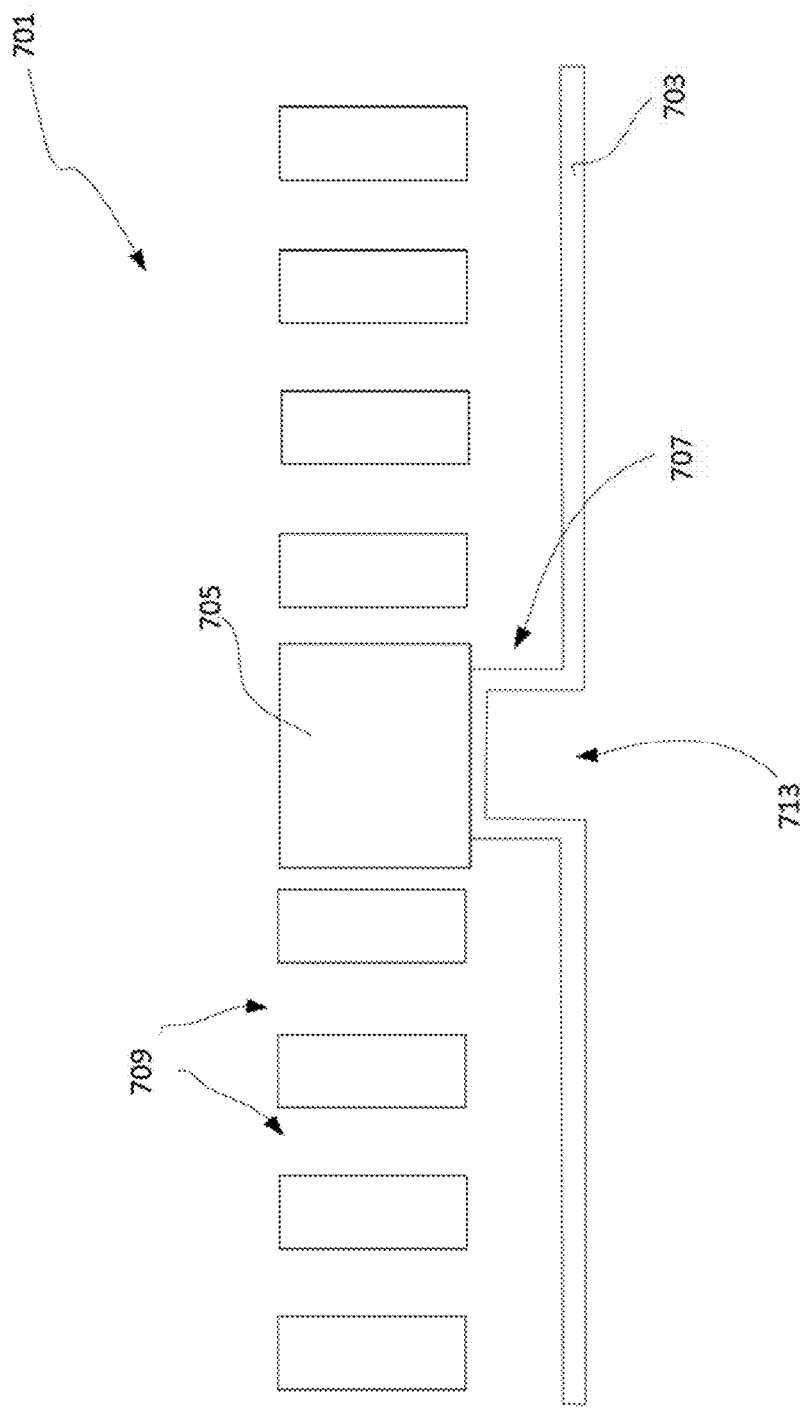
FIG. 7 is a cross-sectional view of a MEMS microphone according to yet another embodiment of the disclosure.

FIG. 7 illustrates a MEMS microphone 701 according to one embodiment. The MEMS microphone 701 is similar in construction to the MEMS microphone 101 of FIG. 1. In contrast to the microphone 101 of FIG. 1, the membrane 703 includes a support member 707 located near an approximate center 713 of the membrane 703 and/or the backplate 705. The support member 707 is integrated into the membrane 703 as a single structure. Optional structures, such as those structures described in FIGS. 4A-4D, may be coupled to and suspended below the membrane 703. The height and width of the support member 707 may be modified according to the particular application.

MEMS microphones 101, 301, 401, 501, 601, 701 with centered supported membranes allow radial expansion or contraction to release residual stress, and thereby are compliant with enhanced sensitivity.

Thus, embodiments of the disclosure provide, among other things, a MEMS microphone with a center-supported membrane and one or more overtravel stops. The membrane includes various features that help determine the response characteristics for the membrane and thus, the response characteristics for the MEMS microphone. The overtravel stops restrict movement of the membrane to prevent overtravel and provide support for the center-mounted membrane. Various features and advantages of the disclosure are set forth in the following claims.

What is claimed is:

1. A micro-electromechanical system (MEMS) microphone comprising:
    a membrane having a predetermined stiffness and a central region, wherein the membrane includes a surface and corrugations positioned on the surface, the corrugations setting the predetermined stiffness of the membrane;
    at least one spring, the at least one spring having a first end and a second end, the first end connected to the membrane and the spring providing an electrical pathway to generate a bias voltage on the membrane, wherein the spring is formed from a portion of the membrane;
    a backplate that is rigid with respect to a housing of the MEMS microphone and electrically biased with respect to the membrane; and
    a support connected to the central region of the membrane and connected to the backplate, the support positioned between the membrane and the backplate.

2. The MEMS microphone of claim 1, wherein the membrane has an approximate center and the approximate center is positionally fixed relative to the backplate by the support.

3. The MEMS microphone of claim 2, wherein the approximate center of the membrane is at a geographical center of the membrane.

4. The MEMS microphone of claim 1, wherein the backplate includes perforations that are configured to allow acoustic pressure to pass through the backplate and to the membrane.

5. The MEMS microphone of claim 1, wherein the membrane is configured to flex around the support when the membrane receives incident acoustic pressure.

6. The MEMS microphone of claim 1, further comprising an overtravel stop connected to the backplate, the overtravel stop extending through an aperture in the membrane.

7. The MEMS microphone of claim 6, wherein the overtravel stop includes
    a first end fixed to the backplate,
    a structure extending through the aperture of the membrane, and
    a second end positioned on an opposite side of the membrane relative to the first end, the second end configured to stop movement of the membrane in a radial direction.

8. The MEMS microphone of claim 1 comprising only a single spring.

9. The MEMS microphone of claim 1, wherein the at least one spring is positioned along a portion of a perimeter of the membrane.

10. A micro-electromechanical system (MEMS) microphone comprising:
    a membrane having a predetermined stiffness and a central region, wherein the membrane includes a surface and at least one structure positioned on the surface, the structure selected from the group consisting of circle beams, and spokes, the structure setting the predetermined stiffness of the membrane;
    at least one spring, the at least one spring having a first end and a second end, the first end connected to the membrane and the spring providing an electrical pathway to generate a bias voltage on the membrane, wherein the spring is formed from a portion of the membrane;
    a backplate that is rigid with respect to a housing of the MEMS microphone and electrically biased with respect to the membrane; and
    a support connected to the central region of the membrane and connected to the backplate, the support positioned between the membrane and the backplate.

11. The MEMS microphone of claim 10, wherein the membrane has an approximate center and the approximate center is positionally fixed relative to the backplate by the support.

12. The MEMS microphone of claim 11, wherein the approximate center of the membrane is at a geographical center of the membrane.

13. The MEMS microphone of claim 10, wherein the backplate includes perforations that are configured to allow acoustic pressure to pass through the backplate and to the membrane.

14. The MEMS microphone of claim 10, wherein the membrane is configured to flex around the support when the membrane receives incident acoustic pressure.

15. The MEMS microphone of claim 10 comprising only a single spring.

16. The MEMS microphone of claim 10, wherein the at least one spring is positioned along a portion of a perimeter of the membrane.

17. A method of limiting movement of a membrane of a MEMS microphone, the MEMS microphone including a backplate, an overtravel stop and a spring, the method comprising:

coupling a first end of the spring to the membrane having a predetermined stiffness, a central region, a surface and corrugations positioned on the surface, the corrugations setting the predetermined stiffness of the membrane, and the spring providing an electrical pathway to generate a bias voltage on the membrane, wherein the spring is formed from a portion of the membrane;

coupling a center region of the membrane via a support to a center region of the backplate; and positioning an overtravel stop through an aperture in the membrane.

18. The method of claim 17, the method further comprising:

affixing a first end of the overtravel stop to the backplate;

positioning a second end of the overtravel stop on an opposite side of the membrane relative to the first end; and when the membrane moves a predetermined distance in a radial direction opposite the backplate, contacting the second end of the overtravel stop.

19. The method of claim 17, wherein coupling a center region of the membrane via a support includes forming a support in a substrate and directly coupling the center region of the membrane to the backplate via the support.

\* \* \* \* \*